(12) United States Patent
Rose et al.

(10) Patent No.: US 7,304,420 B2
(45) Date of Patent: Dec. 4, 2007

(54) FIELD EMISSION DEVICE

(75) Inventors: Mervyn John Rose, Perthshire (GB); Ravi Silva, Camberley (GB); John Shannon, Surrey (GB); Janos Peter Hajto, Edinburgh (GB)

(73) Assignee: The University Court of the University of Dundee, Dundee (GB)

( * ) Notice: Subject to any disclaimer, the term of this patent is extended or adjusted under 35 U.S.C. 154(b) by 173 days.

(21) Appl. No.: 11/016,346

(22) Filed: Dec. 17, 2004

(65) Prior Publication Data

US 2005/0179366 A1 Aug. 18, 2005

Related U.S. Application Data

(63) Continuation of application No. PCT/GB03/02634, filed on Jun. 19, 2003.

(30) Foreign Application Priority Data

Jun. 19, 2002 (GB) ................. 0214025.9

(51) Int. Cl.
*H01J 1/02* (2006.01)
(52) U.S. Cl. .............. 313/309; 313/336; 313/351; 313/495
(58) Field of Classification Search ............. 313/309, 313/336, 351, 495
See application file for complete search history.

(56) References Cited

U.S. PATENT DOCUMENTS

| | | | | |
|---|---|---|---|---|
| 4,781,444 A | | 11/1988 | Suginoya et al. | ............ 350/357 |
| 5,162,704 A | * | 11/1992 | Kobori et al. | ............ 315/349 |
| 5,209,687 A | | 5/1993 | Konishi | ............ 445/6 |
| 5,210,462 A | | 5/1993 | Konishi | ............ 445/6 |
| 5,717,282 A | | 2/1998 | Oomen et al. | ............ 313/479 |
| 5,777,427 A | * | 7/1998 | Tanaka et al. | ............ 313/309 |
| 5,847,504 A | * | 12/1998 | Baldi | ............ 313/495 |
| 6,197,480 B1 | | 3/2001 | Iguchi et al. | ............ 430/286.1 |
| 6,507,148 B1 | | 1/2003 | Iguchi et al. | ............ 313/582 |
| 6,576,391 B1 | | 6/2003 | Iguchi et al. | ............ 430/270 |

FOREIGN PATENT DOCUMENTS

| | | |
|---|---|---|
| EP | 0926216 A1 | 6/1999 |
| EP | 1087005 | 3/2001 |
| GB | 2378569 A | 2/2003 |
| JP | 60184201 | 9/1985 |
| JP | 6013186 | 1/1994 |
| JP | 6017047 | 1/1994 |
| JP | 8041452 | 2/1996 |
| JP | 9279140 | 10/1997 |
| JP | 2000282024 | 10/2000 |
| JP | 2001068016 | 3/2001 |
| WO | WO 96/26529 | 8/1996 |
| WO | WO 98/28296 | 7/1998 |
| WO | WO 98/49219 | 11/1998 |

* cited by examiner

*Primary Examiner*—Vip Patel
(74) *Attorney, Agent, or Firm*—Winston & Strawn LLP

(57) ABSTRACT

A field emission device having improved properties and which finds use in display devices, such as a flat panel displays. Known devices and displays suffer from problems such as complexity of fabrication and limited color gamut. The present device provides a field emission backplate which is made from a substantially semiconductor based material and has a plurality of grown tips. The device also includes at least one electro-luminescent or photo-luminescent material having a fluorescent material such as a fluorescent dye doped material chemically attached thereto.

27 Claims, 12 Drawing Sheets

FIELD EMISSION DEVICE

CROSS-REFERENCE TO RELATED APPLICATIONS

This application is a continuation of International Application PCT/GB03/02634 filed Jun. 19, 2003, the entire content of which is expressly incorporated herein by reference thereto.

FIELD OF INVENTION

The present invention relates to an improved field emission device including a fluorescent dye doped material and to the use of such fluorescent dye doped materials in a field emission device. The field emission device may particularly, though not exclusively, be used in a display device such as a so-called "flat panel" display. The invention also relates to a novel hybrid display device.

BACKGROUND

Flat panel displays are of immense importance in electronics. In current developments, Active Matrix Liquid Crystal Displays (AMCLD) are beginning to challenge the dominance of Cathode Ray Tube (CRT) technology. AMCLD devices are non-emissive and require complex lithography. Filters and matching spectral backlights are required to produce color. However, there are many light losses and inherent complexity in AMCLD devices because of the non-linear nature of liquid crystal materials. These result in a display that is less bright than a CRT, with a smaller color gamut and poorer viewing angle and contrast. Also, due to the non-emissive nature of the display, inefficient use of input electrical power is made, often with well over 70% of the energy being lost as non-useful energy.

Field emission displays based on conventional "Spindt tip" technology promised a solution to many flat panel display problems. Field emission displays (FED=s) are essentially flat cathode ray tube (CRT) devices. However, rather than one electron gun firing electrons at a phosphor on a screen through a shadow mask, the FED has tens or hundreds of individual tips in each display pixel. The tips are known as Spindt tips, after Cap Spindt. The process of fabrication relies on defining a pattern of holes in a gate metal by photolithography. An underlying insulator is then etched in an isotropic wet etch that "undercuts" leaving a well beneath the metal. A sacrificial layer, usually nickel, is then evaporated onto the surface at an oblique angle to ensure the well is not filled. The emitter material, usually tungsten or molybdenum, is then evaporated through the holes into the well. As the evaporated metal builds up on the surface on the sacrificial layer, it closes the hole as the thickness increases, and has the effect of providing an emitter tip in the well. The top layer of metal is then removed by etching the sacrificial layer, leaving the tip, the well, and the original gate material. This forms the backplate of Spindt tips. A top plate containing a patterned phosphor is then placed relative to the backplate using spacers. The final device may then be evacuated to allow the electrons emitted a long mean free path. However, the device may alternatively be provided with an emission layer disposed between the Spindt tips and the top plate.

The principle of field emission from microtips is well understood and is governed by Fowler-Nordheim tunnelling. The emission current, and therefore the brightness of the display, depends only on the current density, the number of tips and their sharpness, i.e.

$$I = J_{FN} n \alpha$$

where, n=number of tips, α=the tip sharpness, and $J_{FN}$=the Fowler-Nordheim tunnelling current density. The tips will provide a sharp electron source that will provide hot electron injection into an emission layer comprising, for example, an electro-luminescent material.

Unfortunately, the extreme complication in fabrication has limited the use of this technology. Additionally, crystal silicon emitters are limited by the wafer size.

Further, when such devices are provided with a polymeric electro-luminescent emission layer, the emission layer is often fabricated by applying the polymer material to a preformed backplate using a relatively low cost technique such as spin coating, dip-coating or solution casting. However, the polymers which allow such techniques to be performed easily are typically low molecular weight organic materials, often having chemical or morphological instability, and thus the stability of the device as a whole is reduced.

An alternative fabrication technique of using vacuum deposition to dispose the emission layer on the backplate means that the fabrication cost of the device is relatively high.

Other thin-film materials may also be used for field emission. Carbon is the main contender with diamond, diamond like carbon and carbon nano-tubes also being suitable. The use of diamond seemed a good choice, although it is difficult to fabricate and also the mechanism of a supposed negative electron affinity which diamond was claimed to have has now been refuted.

It is the case in some of such known devices that the light emission layer is formed by simply mixing fluorescent dye into the polymer. Such mixes also suffer from morphological instability by phase separation which restricts the application of fluorescent dye mix polymer matrices at high dye concentration.

Accordingly, improvements on the prior art are desired, and these are now provided by the present invention.

SUMMARY OF THE INVENTION

In one embodiment, the present invention now provides a series of polymers or copolymers doped with fluorescent dyes suitable for use in electro-luminescent devices. These polymers or copolymers exhibit good stability and also provide a suitable color gamut for color display applications, namely, materials with primary red, green and blue (RGB) colors.

The present invention also provides a device comprising at least one electro-luminescent and/or photo-luminescent material having a fluorescent material chemically attached thereto. According to a first aspect of the invention, there is provided a device such as a field emission device comprising a field emission backplate, the backplate being made from a substantially semiconductor based material and comprising a plurality of grown tips, the device further comprising at least one electro-luminescent and/or photo-luminescent material, the at least one electro-luminescent and/or photo-luminescent material having at least one fluorescent material chemically attached thereto.

BRIEF DESCRIPTION OF DRAWINGS

These and other aspects of the present invention will now be described, by way of example only, with reference to the following description when taken in combination with the accompanying drawings, which are.

DETAILED DESCRIPTION OF THE PREFERRED EMBODIMENTS

Figure 1:
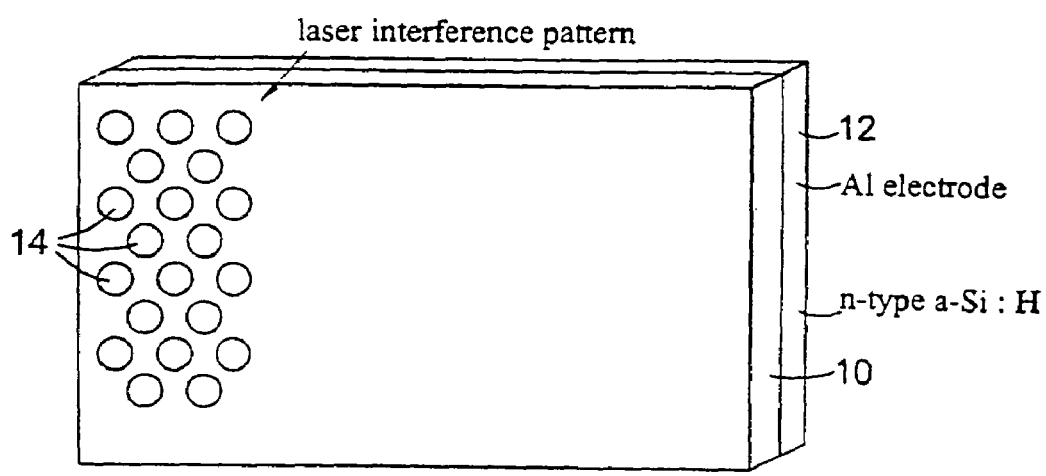
FIG. 1 a schematic representation of a thin film of amorphous silicon onto which is projected a laser interference pattern.

Herein, regarding a polymer of the at least one electro-luminescent and/or photo-luminescent material, by chemically attached is meant either attached as a side group onto the polymer, or incorporated into a main chain backbone of the polymer, or a combination of each or both.

The chemical attachment of the at least one fluorescent material to the at least one electro-luminescent and/or photo-luminescent material provides a number of advantages including efficiency for electro-luminescent and/or photo-luminescent light generation, thus improving device lifetime and device color gamut, particularly for use as or in a display device.

Advantageously the at least one electro-luminescent and/or photo-luminescent material comprises an electro-luminescent material.

Preferably the plurality of tips are formed on a thin film of semiconductor based material.

It will be understood that in the context of the present invention the term "thin film" is used to mean a film of typically a few nanometers, for example, 1 to 100 nm and typically 10 nm.

Preferably the grown tips are "profiled", that is to say grown in a manner resulting in a sharp pointed shape.

Conveniently the semiconductor based material is silicon or an alloy thereof.

The backplate may comprise an n-type semiconductor based material. The backplate may instead comprise amorphous silicon or silicon hydride, e.g. n-type.

Preferably the at least one fluorescent material comprises at the at least one fluorescent dye, and the electro-luminescent and/or photo-luminescent material may comprise a fluorescent dye doped material.

Conveniently the at least one fluorescent material may comprise three fluorescent dyes (e.g. for red/green/blue light generation, respectively).

Conveniently the fluorescent dye doped material comprises a polymer which is combined with Nile red, C5, and BisMSB dyes for red, green and blue light generation respectively.

Conveniently the polymer may be poly(9-alkylfluorene).

Alternatively the polymer may be poly(9,9-dialkylfluorene).

Preferably the at least one electro-luminescent material comprises a polymeric material.

Conveniently the at least one electro-luminescent material may comprise an organic material.

Alternatively the at least one electro-luminescent material may be a fluorescent material.

Most preferably the field emission device comprises at least part of a display device.

Conveniently the field emission device further comprises a substrate, a fluorescent dye doped material layer comprising the at least one electro-luminescent material having the at least one fluorescent material chemically attached thereto, and a transparent window.

Conveniently the transparent window may comprise a thin film transparent metal or metallized phosphor.

At least one fluorescent dye molecule of the at least one fluorescent material may be chemically attached to a polymeric material molecule of the at least one electro-luminescent material as a side group.

Alternatively or additionally at least one fluorescent dye molecule of the at least one fluorescent material may be chemically attached to a polymeric material of the at least one electro-luminescent material by incorporation into the polymeric material molecule main chain backbone.

According to a first embodiment of the present invention there is provided an electro-luminescent and/or photo-luminescent material having a fluorescent material chemically attached thereto, the electro-luminescent and/or photo-luminescent material comprising a polymeric material comprising an amorphous polysilyene doped with at least one fluorescent dye chemically attached to the polymeric material.

It should be understood that the polymeric material may be a polymer, and it should be further understood that by polymer is included a homopolymer or copolymer.

Preferably the polymer(s) or copolymer(s) may be a high temperature polymer.

Alternatively the polymer(s) or copolymer(s) may be a pyrazol based organic material.

According to a second embodiment of the present invention there is provided a fluorescent dye doped material comprising polymer based micro-spheres formed of a first polymeric material doped with at least one fluorescent dye, wherein the micro-spheres of the first polymeric material are embedded within a polymer based host, and wherein the polymer material based host is formed of a second polymeric material.

Preferably the first polymeric material has a higher refractive index than the second polymeric material.

Conveniently the first polymeric material has a higher, or alternatively lower softening temperature than the second polymeric material.

Preferably the first polymeric material comprises polystyrene doped with at least one fluorescent dye.

Preferably the second polymeric material comprises an ethylene-vinyl-acetate based polymer.

According to a first form of the second embodiment the micro-spheres are formed of ethylene-vinyl acetate based polymer(s) containing chemically attached fluorescent dye (s) on the polymer main chain.

According to a second form of the second embodiment the micro-spheres are formed of ethylene-vinyl acetate based polymer(s) containing chemically attached fluorescent dye(s) on the polymer side chain.

According to a third form of the second embodiment the micro-spheres are formed of ethylene-vinyl acetate polymers containing chemically attached fluorescent dye based compound moieties on both the side chain and the main chain of the polymer.

According to a third embodiment of the present invention there is provided a fluorescent dye doped material, the material comprising a high temperature polymer doped with at least one fluorescent dye.

According to fourth embodiment of the present invention there is provided a fluorescent dye doped material, the material comprising an organic polymer, wherein at least one fluorescent dye is chemically bonded to the molecules of the organic polymer.

Preferably the organic polymer is a pyrazol based organic polymer.

Pyrazol based compounds used in the polymeric material of the electro-luminescent device has the general formula

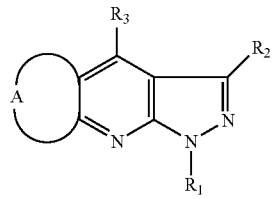

where A is a substituent selected from the group consisting of substituted or unsubstituted aromatic or heteroaromatic rings and a substituted or unsubstituted pyrazolic moiety; and R1 to R3 are substituents, identical or different, chosen from the group consisting of hydrogen, halogens and alkyl, aryl, heterocyclic, alkenyl, alkynyl, alkoxy, allyoxy, aryloxy, benzyloxy, hydroxy and amino groups. The fluorescent dye moiety may be attached to the pyrazol via the $R_3$ substituent.

Conveniently the pyrazol based organic polymer can be used in the form of a polymer matrix doped with at least one fluorescent dye.

Conveniently at least one fluorescent dye moiety may be attached to the side chain of the organic polymer.

Alternatively at least one fluorescent dye moiety may be attached to the organic polymer main chain.

Conveniently fluorescent dye moieties may be chemically attached on both the polymer side chain and main chain.

According to a fifth embodiment of the present invention there is provided a fluorescent dye doped material comprising polymer based micro-spheres formed of a first polymeric material doped with at least one fluorescent dye, wherein the first polymeric material micro-spheres are embedded within a polymer based host comprising a second polymeric material, the first polymeric material having a higher softening temperature than the second polymeric material.

Preferably a diameter of the micro-spheres is substantially the same as a wavelength of fluorescent light emitted by the fluorescent dye molecules resulting in optical resonance effects occurring within the micro-spheres thereby enhancing the intensity of the fluorescent light.

According to a second aspect of the present invention there is provided a field emission device comprising a field emission means and an electro-luminescent and/or photo-luminescent material doped with at least one fluorescent dye, wherein the electro-luminescent and/or photo-luminescent material is a fluid.

Conveniently the electro-luminescent material comprises a fluorescent dye doped material which optionally comprises a polymer which is combined with Nile red, C6, and BisMSB dyes for red, green and blue light generation, respectively.

Conveniently the polymer may be poly(9-alkylfluorene).

Alternatively the polymer may be poly(9,9-dialkylfluorene).

According to a first embodiment of the present invention there is provided a fluorescent dye doped material which is a polymer dispersed liquid crystal fluid wherein the liquid crystal fluid is doped with at least one fluorescent dye.

Conveniently the fluorescent dye doped liquid crystal fluid is dispersed within a solid polymer matrix.

Preferably the at least one fluorescent dye is dissolved within the liquid crystal fluid.

Conveniently the refractive index of the polymeric material and a refractive index of the liquid crystal fluid are not matched.

Preferably the refractive index of the polymeric material is lower than the refractive index of the liquid crystal fluid.

According to a second embodiment of the present invention there is provided a fluorescent dye doped material comprising a liquid solvent doped with at least one fluorescent dye.

Preferably the liquid solvent may be a monomer or polymer based material.

Alternatively the liquid solvent may be an aromatic or fluorinated aromatic solvent such as toluene, xylene, fluorobenzene or the like.

According to a third embodiment of the present invention there is provided a fluorescent dye doped material comprising a liquid solvent wherein the liquid solvent is doped with red fluorescent dye, green fluorescent dye and blue fluorescent dye with the ratio of each dye being such that, in use, each can emit red, green or blue light in a manner which produces additive white color light.

Conveniently a microtip device using such a white emitting solvent-dye mixture may be used as a backlight for a liquid crystal display panel.

According to a fourth embodiment of the second aspect of the invention there is provided a fluorescent dye doped material, the material comprising an organic monomer, wherein at least one fluorescent dye is dispersed throughout the organic monomer.

The organic monomer may be 1,2,4-triazole (TAZ) which is an electron transport monomer.

Alternatively the organic monomer may be Tris(8-quinolato) aluminium (III) complex (ALQ) which is an electron transport monomer.

According to a third aspect of the present invention there is provided a field emission device comprising a field emission means and an electro-luminescent and/or photo-luminescent material doped with at least one fluorescent dye, wherein the electro-luminescent and/or photo-luminescent material comprises a plurality of discrete bodies of material interspersed in a host material.

The field emission means may comprise a field emission backplate.

The discrete bodies may comprise spheres, e.g. microspheres or droplets.

The discrete bodies may have a size/diameter of within the wavelength range of light, e.g. visible light, e.g. 200 nm to 400 nm, and particularly 200 nm to 350 nm.

The discrete bodies may have a concentration within the host material of 1% to 80% or 1% to 60%.

According to a fourth aspect of the present invention there is provided an electro-luminescent and/or photo-luminescent material and a host material, wherein the electro-luminescent and/or photo-luminescent material comprises a plurality of discrete bodies of material interspersed in the host material.

According to a fifth aspect of the present invention there is provided an electro-luminescent device comprising a field emission device according to the first, second or third aspects of the present invention, wherein in use, the device employs AC driving electron injection, the electrons exciting the fluorescent dye in the electro-luminescent material or polymer by impact ionization.

The device may have a threshold voltage below which the device acts as a loss free capacitor and above which the electrons injected into the electro-luminescent material or polymer excite the dye by impact ionization.

According to a sixth aspect of the present invention there is provided a display device, such as a flat panel display or light emitting device, comprising a field emission device according to the first, second or third aspects of the present invention.

According to a seventh aspect of the present invention there is provided use of an electro-luminescent material or fluorescent dye doped material according to any of the foregoing embodiments of the present invention in a field emission device, display device, or light emitting device.

According to an eighth aspect of the present invention there is provided a field emission device, light emitting device or display device comprising an electro-luminescent material or fluorescent dye doped material according to any of the foregoing embodiments of the present invention.

The fluorescent dye doped material may be an organic polymer.

Herein it will be understood that the term polymer is meant to include monomers and copolymers.

According to a ninth aspect of the present invention there is provided a field emission device comprising a metal base, an insulator layer, a polymer-fluorescent dye layer, a second insulator layer and a transparent window, wherein the device operates using an AC driving electron injection.

Conveniently the field emission layer is formed of a metal.

Preferably the transparent window is formed of a metal or metal based compound, e.g. Indium Tin Oxide (ITO).

According to a tenth aspect of the present invention there is provided a method of manufacturing a field emission device comprising:
  forming a plurality of tips on a thin film of semiconductor based material;
  disposing a thin film of transparent metal on a glass substrate;
  disposing a thin film of dye doped wide band-gap light emitting material upon the thin film of transparent metal;
  embedding an exposed face of the light emitting material onto the plurality of tips.

Preferably the tips are grown in a manner resulting in a substantially sharp pointed shape.

Conveniently the tips are grown and etched simultaneously.

Preferably the tips may be formed by selective growth of crystalline semiconductor based material on a plurality of crystallized areas on the thin film of semiconductor based material.

Referring initially to FIG. 1, there is shown a thin film of amorphous silicon 10 disposed upon a substrate of aluminum 12, wherein a pattern of dots 14 caused by a laser interference pattern can be seen upon a region of a surface of the silicon film 10. The thin film of amorphous silicon 10 is disposed on the substrate of aluminum 12 by Plasma Enhanced Chemical Vapor Deposition (PECVD). A Nd:YAG pulse laser (not shown), having a pulsing duration in the region of 3 to 7 nanoseconds, is used to form an interferometer, with the beam being split and brought back together forming the pattern of dots 14. The thin film silicon layer 10 is positioned in a plane in which the interference pattern of the laser is formed. The laser interference pattern acts upon the silicon film or layer 10 creating areas, or regions, of crystallization corresponding to dots 14. A single pulse of the Nd:YAG laser is used to locally crystallize the areas. The laser beam is synchronized with a step and repeat system in the plane of the thin film 10 causing the laser spots or dots 14, and hence the crystallized areas, to be distributed over the entire surface plate of the thin film silicon 10, thus allowing a high density of tips to be made. By using this step and repeat system an emitter plate may be made of any chosen size. An area of 30 μm×30 μm is typical for an individual pixel, and hence a micro-tip density of 300×300 which equals $9×10^4$ per Red Green Blue (RGB) pixel will be achieved. Such density of emitters is of crucial importance as the emission current of a field emission device depends on the number of tips and their sharpness.

Figure 2:
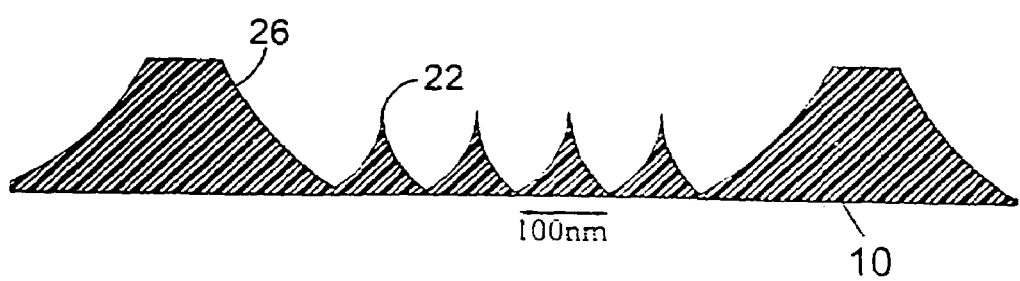
FIG. 2 a cross-sectional view of a side profile of a grown crystalline silicon backplate or emitter plate suitable for use in the present invention.

A selective etch and growth process involving a dilute silane/hydrogen plasma is used to form micro-crystalline silicon by allowing strained bonds within a silicon array, to be broken by mobile hydrogen while deposited silicon atoms form thermodynamically stable crystalline sites. To form emitter tips upon the laser treated thin film silicon 10, the thin film silicon 10 is subjected to a dilute silane/hydrogen plasma in a reactor. This process is applied to the PECVD deposited thin film silicon 10 which has been laser treated, whereby deposition of silicon atoms will only take place on a crystalline substrate and therefore upon the crystallized areas of the thin film silicon 10. Amorphous or weak bonded areas of the structure are simultaneously grown and etched. Continued growth has the effect of profiling the edges of the growing film where the etching effect is more dramatic. As, in the arrangement of the present invention, the crystalline area is typically limited in size to less than 100 nm, the aspect ratio is such that the edges converge. Therefore, each circular region of 100 nm or less of the emitter plate therefore effectively grows a profile tip. A cross-section of the tips grown is shown in FIG. 2. It is this profiling that leads to field enhancement of the emitter plate which gives a low threshold, of around 15 v/μm for field emission, and thus higher emitter current (i.e. in excess of $10^{-5}$ amps). The growth and etching processes are mediated by mobile hydrogen and the aspect ratio profiling etching leading to sharp tips 22 over the entire growing surface of the plate of thin film silicon 10.

Spacers 26 are also formed by allowing the pulsed laser to rest upon certain areas of the thin film silicon 10 to create line or dot crystalline structure that have dimensions much larger than those of the emitter dots 14. This results in a thicker deposited film being formed upon these crystalline areas. Thus spacers 26, such as those in FIG. 2, are grown at the time as the emitter tips 22, allowing placement of gates for a three terminal device.

As the emission current, and therefore the brightness of a display, depends upon the current density, the number of tips 22, and their sharpness (according to $I=J_{FN}n\alpha$), the tips 22 provide a sharp electron source that will provide hot electron injection into a light emitting layer of a device as will hereafter be described. The electron injected into a light emitting layer gains energy from an applied field, that is the field which is applied across the aluminium substrate 12, which acts as an electrode.

Using emitter tips 22, which are formed as described above, the field emitted electrons have energies in excess of 2 eV. This corresponds to electron energies of approximately 20,000K to 30,000K in a material at room temperature. However, the balance between energy gain from the electric field and energy loss due to the lattice of the crystalline silicon structure is a statistical process. For example, some of the electrons have much larger momentum in the direction of the electric field than average thermal energy, i.e. the energy distribution is no longer a thermal one. Under high applied electric field ($E>10^6$ Vcm$^{-1}$) conditions, runaway electrons occur. Runaway electrons occur eventually with a concentration ratio of $1:10^6$ between "hot" and "cold" electrons. To rely on these runaway electrons to generate electroluminescence (EL), would limit the efficiency of EL to less than $10^{-6}$, as all the cold electrons add to the electrical energy input the same amount, but nothing to the light output. However, there are conditions where the fraction of hot electrons can be very high. In the avalanche breakdown regime electrons reach high enough energy not only to excite the EL molecules, but also to multiply. Therefore, under avalanche breakdown conditions, EL devices operate at high efficiency. However, avalanching must be stabilized or kept reversible in order to ensure a sufficient lifetime for the device. Avalanche can be controlled by either a series resistance which limits the current and thereby the power, or a series capacitance which limits the charge and thereby the energy dissipated in the device. The advantage of the latter is that, in the case of a local breakthrough a resistive film exhibits the "spreading resistance" phenomenon derived from Maxwell's Equations, i.e. resistance spreads radially, whereas a dielectric does not.

Figure 3:
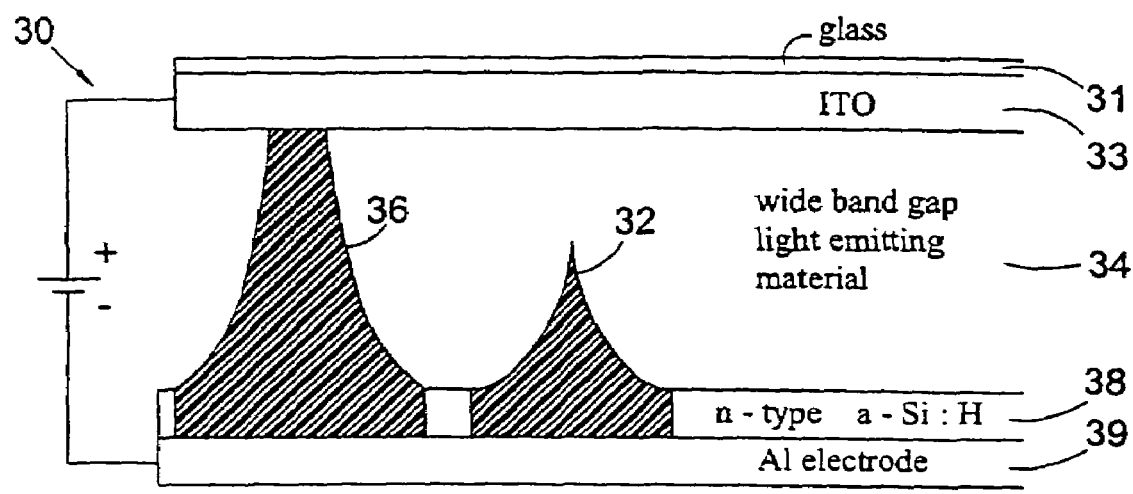
FIG. 3 a schematic representation of an electro-luminescent display device including a field emission device according to a first embodiment of the present invention.

Referring now to FIG. 3, there is shown a schematic representation of a field emission or emitting device 30 according to a first embodiment of the present invention having crystallized silicon emitter tips 32 formed in the same way as tips 22 described with reference to FIGS. 1 and 2. The field emitting device 30 provides a wide band-gap emitting material 34 disposed on the field emission tips 32, which acts as a light emitting medium, in use. The device 30 further has spacers 36 grown on the micron scale.

The substrate 39 of the device 30 in this case is formed of aluminium, onto which a thin film semiconductor based material 38, in this case thin film hydrogenated n-type amorphous silicon, is disposed by PECVD. The silicon is then treated to form the emitter tips and gates as described previously.

A diode configuration is fabricated with a thin film transparent metal such as Indium Tin Oxide (ITO) 33 being disposed on a glass substrate 31. The plate of patterned ITO 33 on the disposed glass substrate 31 then has a thin film, of the order of many microns, of wide band-gap light emitting polymer 34 disposed upon it by, for example, screen printing. In this case the polymer 34 is PMPSi doped with fluorescent dye, e.g. Cadmium 6. The exposed face of light emitting polymer layer 34 is then pressed onto the crystalline silicon tips 32 of the "backplate". An Al—Si-polymer-ITO diode structure is thus formed with the polymer of the arrangement being cured upon baking the device 30 to a temperature of approximately 100° C. Electrical connections to the aluminium layer 39 and ITO layer 33 allow an electric field to be applied to the device 30.

Figure 4A:
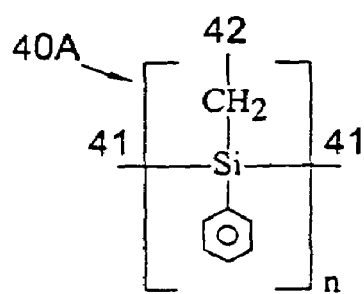
FIG. 4A a representation of a first general formula of a polymeric material for use in the present invention.
Figure 4B:
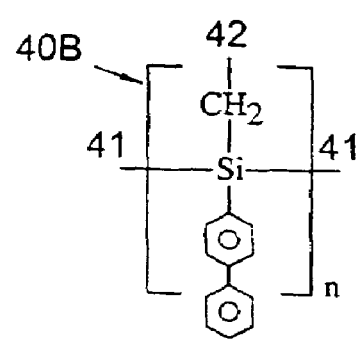
FIG. 4B a representation of a second general formula of a polymeric material for use in the present invention.

In FIG. 4A there is shown a general formula, or monomer 40A, of the PMPSi polymeric material which is shown as the light emitting polymer 34 in the device 30 of FIG. 3. In FIG. 4B there is shown the general formula, or monomer 40B of a PBMPSi polymeric material which may alternatively be used as the light emitting polymer 34 of the device 30 shown in FIG. 3. In each of these cases the light emitting material 34 is an amorphous poly(silyene) doped with fluorescent dyes which are chemically attached to the polymer.

With reference first to FIG. 4A there is shown a schematic representation of the basic monomer 40A of the poly(methylphenylsilyene) PMPSi structure which can be used as the wide band-gap light emitting material 34, the polymer comprising n monomers. For use in electro-luminescent devices such as those described, this polymer 41 is doped with at least one fluorescent dye such as C6 (emitting green light), nile red (emitting red light), BisMSB (emitting blue light) or other such fluorescent dyes including lumogen red (red emitter), lumogen green (green emitter), lumogen violet (blue emitter). These dyes can be chemically bonded with the PMPSi either by attachment as a side group onto the monomer at point 42, or alternatively, a molecule of such fluorescent dyes can be incorporated into the main chain backbone of the PMPSi polymer at either or both of points 41 of the monomer. Furthermore, more than one fluorescent dye molecule can dope each monomer of the polymer and these dye molecules can be incorporated at both side chain or main chain locations.

With reference now to FIG. 4B there is shown a schematic representation of a general formula or monomer 40B for poly(biphenylmethylsilyene) PBMPSi which can be similarly doped with one or more of C6, nile red, BisMSB or other fluorescent dyes, with the doping molecules being included at either or both of side chain or main chain locations within the polymer structure in the same manner as with PMPSi. As above the polymer comprises n monomer groups.

By chemically attaching fluorescent dye molecules to the polymer host, the efficiency of photo-luminescent and/or electro-luminescent light generation of the material is improved, thus increasing the life span of the material and improving the color gamut available for display applications. This improvement in color gamut is possible by the inclusion of more than one dye dopant within the polymer. For example, C6, Nile red and BisMSB can be used in ratios such that white light is emitted.

By using a polymer material such as that of FIGS. 4A and 4B, which is based not only on Carbon (C) bond but also Silicon (Si) bonds, properties such as durability, temperature resistance and chemical stability of the material are increased.

Figure 5:
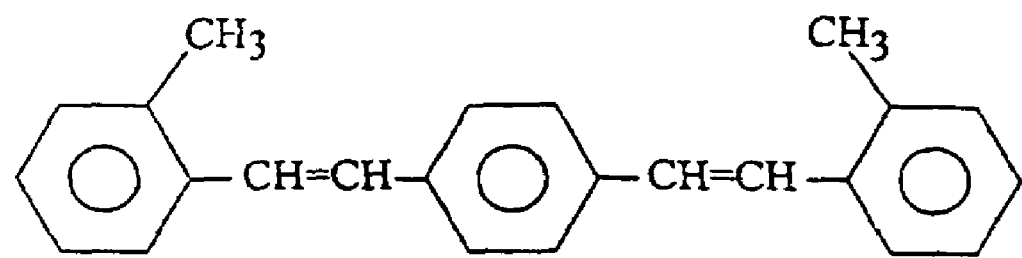
FIG. 5 a schematic representation of the molecular structure of a fluorescent dye suitable for use in the present invention.

An example of a first fluorescent dye which may be used to dope the polymers of FIGS. 4A and 4B is shown in FIG. 5. In this case there is shown the molecular structure of fluorescent dye p-Bis(2-methylstyryl)benzene (Bis-MSB), which is a blue fluorescent laser dye available from Sigma-Aldrich Company Ltd, Dorset, UK. This dye has a maximum fluorescent emission wavelength in the region of blue visible light. The empirical formula is $C_{24}H_{22}$ and the molecular weight is 310.44. A series of PMPSi and PBMPSi based polymers or copolymers doped with fluorescent dyes, such as Bis-MSB, have good stability due to the aforementioned chemical bonds.

The dye may be bonded, for example, via the —$CH_3$ group of the fluorescent dye to the —$CH_2$ group at point 42 of the poly(methylphenylsilyene) and the poly(biphenylmethylsilyene) polymers.

Figure 6:
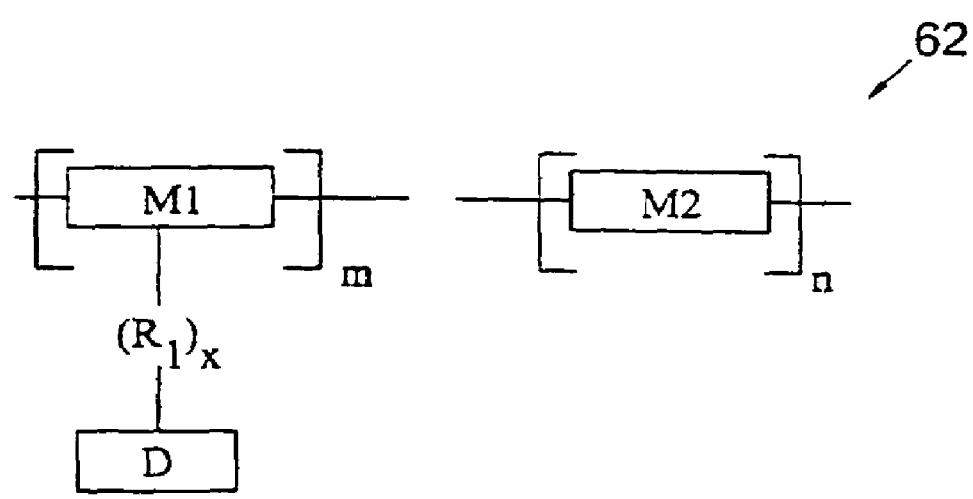
FIG. 6 a schematic representation of a general formula of a first fluorescent dye doped polymeric material suitable for use in the present invention.

With reference to FIG. 6 there is shown a schematic representation of a general formula for a polymer or copolymer having a dye dopant attached. In this representation M1 and M2 are monomer units, and may be the same or different monomer units. In this case a co-polymer structure comprising a dye doped polymer 62 is shown with unit M1 being PMPSi and unit M2 being PBMPSi. D is the fluorescent dye moiety, which in this case is C6 and the dye moiety is connected to M1, as a side group, via $(R_1)_x$. $(R_1)_x$ is one or more alkyl group of the formulae —{C(—$R_3$—P)$R_4$—$CH_2$}-and -{$CR_5R_6$—$CH_2$}- where: $R_3$ is alkyl groups, alkoxy groups, alkyl ester, alkyl amide, allyoxy groups, aryloxy groups, benzyloxy groups or hydroxy groups; $R_4$ and $R_5$ are hydrogen or methyl groups; and $R_6$ is hydrogen, hydroxy groups, alkyl groups, aryl groups, substituted or not, heterocyclic groups, substituted or not, alkoxy groups, alkyl ester, alkyl amide, allyoxy groups, aryloxy groups, and benzyloxy groups. Light emitted from a device constructed using the dye doped polymer 62 is thus green.

Figure 7:
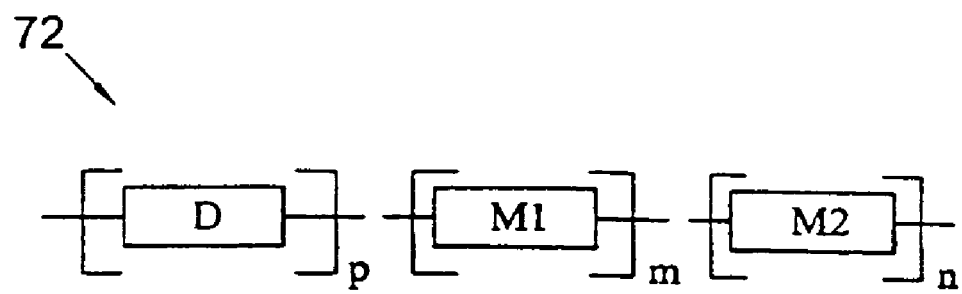
FIG. 7 a schematic representation of a general formula of a first fluorescent dye doped copolymeric material suitable for use in the present invention.

In FIG. 7 an alternative dye doped co-polymeric material 72 is shown. Monomers M1 and M2 are, as before, PMPSi and PBMPSi respectively. However, in this material 72, the fluorescent dye doped moiety D, which is C6, is attached on the polymer main chain to monomer M1. This dye doped polymeric material 72 combines high charge carrier mobility, i.e. $-10^{-4}$ $cm^2V^{-1}$, with high quantum efficiency for luminescent light generation, i.e. of around 90% to 100%, dependent on the dopant concentration. As before this material can be a polymeric material with M1 and M2 being the same monomer units.

Figure 8:
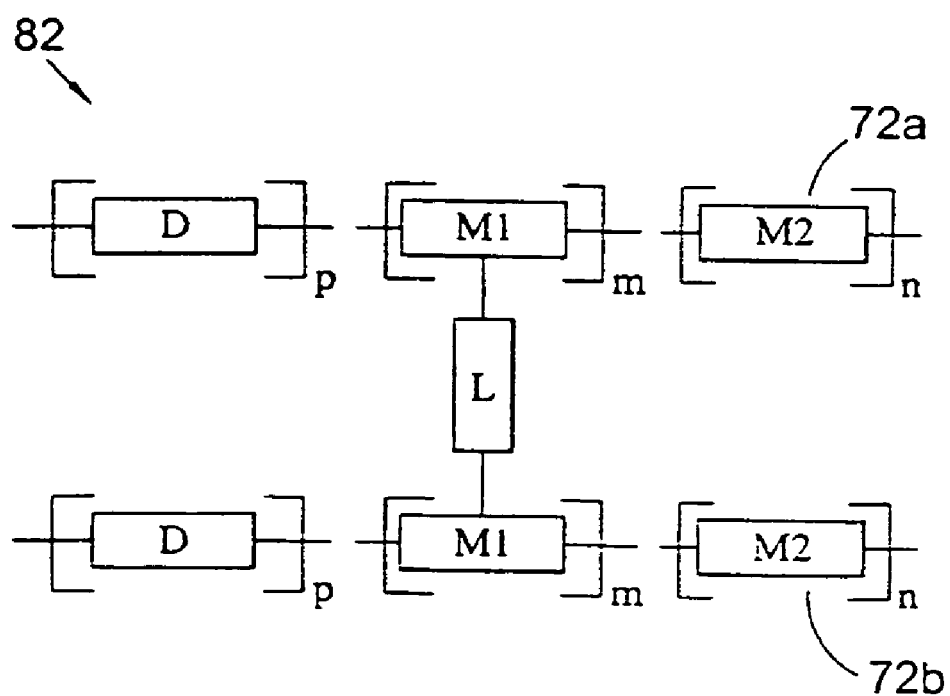
FIG. 8 a schematic representation of a second fluorescent dye doped polymeric material suitable for use in the present invention.

A compound shown in FIG. 8 is a further dye doped polymeric material 82 with D, M1 and M2, as before, C6, PMPSi and PBMPSi respectively. L is, in this case, an alkyl group, however, it could alternatively be an alkoxy group. The alkyl group L allows polymer matrices 72a and 72b to be cross-linked forming polymeric material 82 with such cross-linking having the benefit of improving the material stability.

Figure 9:
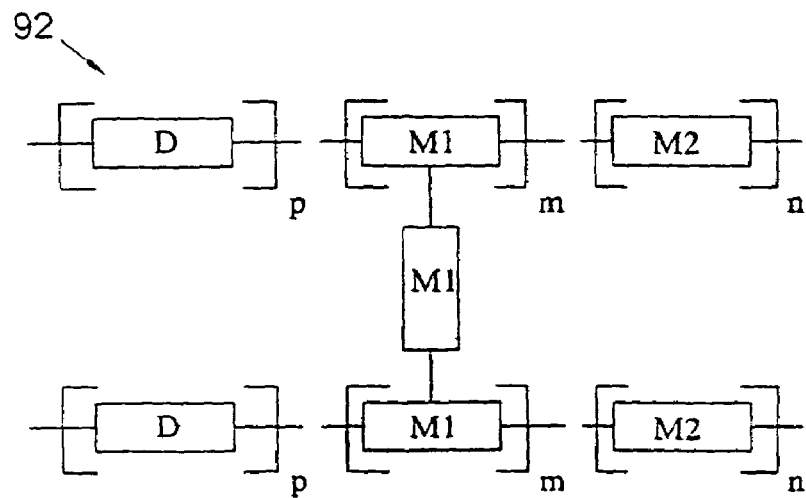
FIG. 9 a schematic representation of a third fluorescent dye doped polymeric material suitable for use in the present invention.

A similar polymeric structure is shown in FIG. 9, however, in this case monomer group M1 is used to cross-link the polymeric structures 72a and 72b to form polymeric structure 92. In the structure 92, the link monomer can alternatively be M2. Furthermore, the fluorescent dye moiety can further be incorporated on the side chain as well as in the main chain of the polymer.

The use of such dye doped polymeric material as a light emitting material in an electro-luminescent device, wherein the dye doping is chemically attached to the polymer results in decrease in morphological instability by phase separation. Such restricts the application of fluorescent dye mixed polymers at high concentrations where the fluorescent dye is simply mixed into the polymer.

Figure 10:
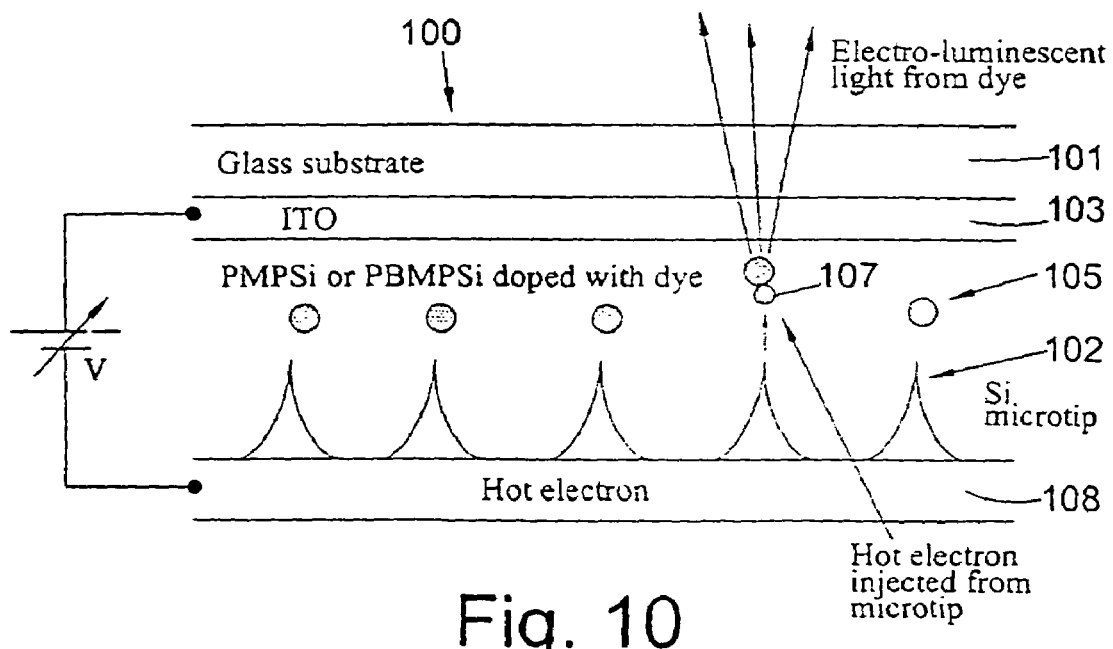
FIG. 10 a schematic representation of an electro-luminescent device according to a second embodiment of the present invention.

In FIG. 10 there is shown a second embodiment of an electro-luminescent device 100 according to the present invention having a light emitting material 100 comprising fluorescent dye doped PMPSi. This illustrates a hot electron 107 injected, in use, from a microtip 102 colliding with a dye moiety 105 and causing the generation of electro-luminescent light. These dye doped polymers, having chemical attachments between the dye and the polymer provide high charge carrier mobility ($-10^{-4}$ $cm^2V^{-1}$) for the injected electrons, thus ensuring that the majority of electrons will hit the fluorescent dye centers before recombination in the polymer matrix. Additionally, the fluorescent dye centers have high quantum efficiency for electro-luminescent light generation, i.e. in the region of 90% to 100%.

Figure 11A:
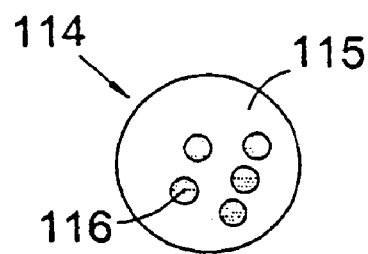
FIG. 11A a schematic representation of a first dye doped fluorescent polymer sphere for use in the present invention.
Figure 11B:
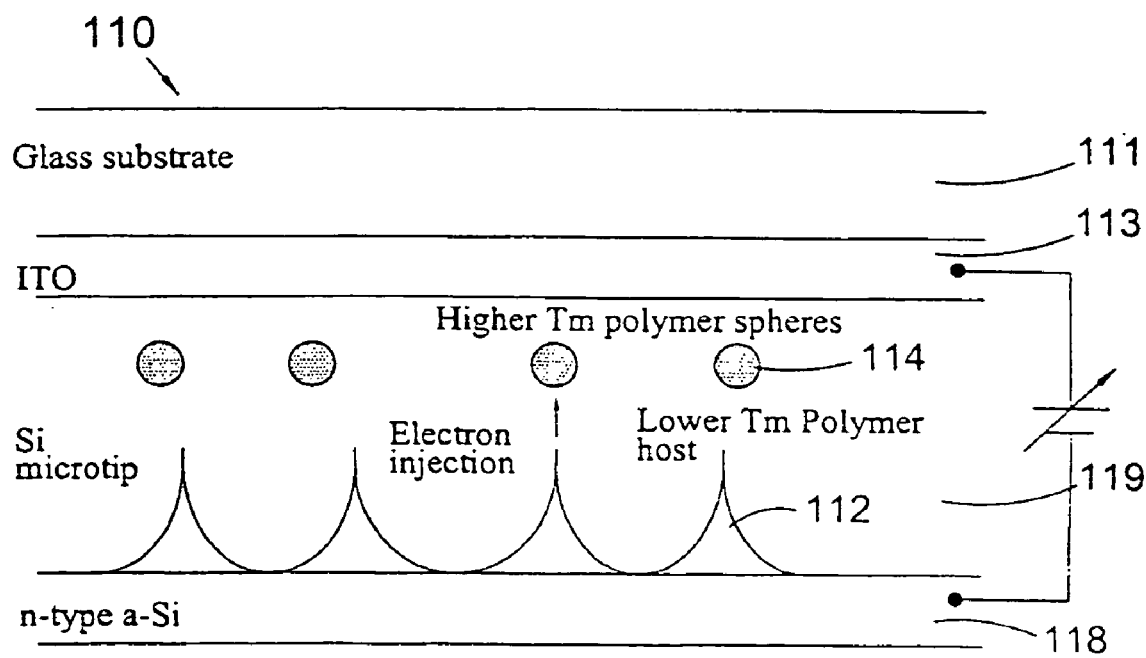
FIG. 11B a schematic representation of an electro-luminescent display device according to a third embodiment of the present invention.

In FIGS. 11A and 11B there is shown a third embodiment of the present invention, wherein a wide band-gap emitting material is formed of spheres, e.g. micro-spheres 114 of a first polymeric material 115 being embedded in a second polymeric material 119. Such spheres 114 are shown in FIG. 11A. Each sphere 114 is formed of polystyrene and is doped with dye molecules 116 which in this case are C6. As detailed previously, the dye molecules are chemically attached to the polystyrene by side chain and/or main chain doping. The polymeric structure requires the dye doped polymeric material 115, in this case polystyrene, to have a higher softening temperature than the host polymeric material 119, in this case ethylene-vinyl-acetate (EVA), in which the dye doped polystyrene spheres 114 are embedded. The softening temperature will be $T_g$ if the polymers are amorphous and $T_m$ if they are crystalline. The fluorescent dye doped polymeric material 115 also has a higher refractive index than the polymeric material 119.

In the electro-luminescent device 110 shown in FIG. 11B, the polystyrene spheres 114 embedded in EVA 119 act as the wide band-gap light emitting material of the device 110. Upon the emission of hot electrons from silicon microtips 112, impact ionization takes place as electrons collide with the dye doped polystyrene spheres 114 and excite the dye molecules 116 within the spheres 114. The dye 116 then emits fluorescent light according to the forbidden optical band-gap of the dye 116. The diameter of the spheres 114, is chosen to be substantially the same as the wavelength as the fluorescent light emitted by the dye 116. Therefore, in use, optical resonance occurs within the sphere 114, enhancing the intensity of the fluorescent light emitted from the device 110.

A further alternative to the disclosed arrangements is that the light emitting materials used in each of the above described devices, may comprise a high temperature polymer such as poly(2,6-dimethyl-1,4-phenylene oxide) which has $T_n$=262C. This may be doped with a fluorescent dye such as C6, and can withstand localized excess heat which is generated during hot electron injection. A further advantage of using a polymer of this type is that it can withstand the application of a high electric field.

Alternative materials which may be used in each of the above devices includes pyrazol based organic and polymeric materials which are doped with fluorescent dyes. These materials have good electron transport properties for electroluminescent device applications. Such materials can be combined with high quantum efficiency fluorescent dyes, such as those detailed earlier, and a combination of the dyes with the pyrazol based materials may be simple mixtures or advantageously chemical attachments. In particular the fluorescent properties or the pyrazol based materials are substantially enhanced by the chemical attachment of a dye into the pyrazol quinoline compounds. An example of such materials is 1,3-biphenyl-4-methyl-pyrazolo [3,4-b] quinoline combined with at least one dye from coumarin-6, coumarin-7, bis-MSB or similar. The fluorescent properties of such an arrangement is substantially enhanced by attaching a dye into a side chain of the material.

Pyrazol based compounds used in the polymeric material of the electro-luminescent device have the general formula:

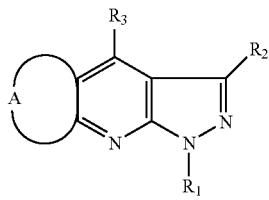

where A is a substituent selected from the group consisting of substituted or unsubstituted aromatic or heteroaromatic rings and a substituted or unsubstituted pyrazol moiety; and R1 to R3 are substituents, identical or different, chosen from the group consisting of hydrogen, halogens and alkyl, aryl, heterocyclic, alkenyl, alkynyl, alkoxy, allyoxy, aryloxy, benzyloxy, hydroxy and amino groups. The fluorescent dye moiety is attached to the pyrazol via the $R_3$ substituent.

A more detailed description of such pyrazol based materials can be found in WO 98/28296 and WO 98/49219.

Figure 12A:
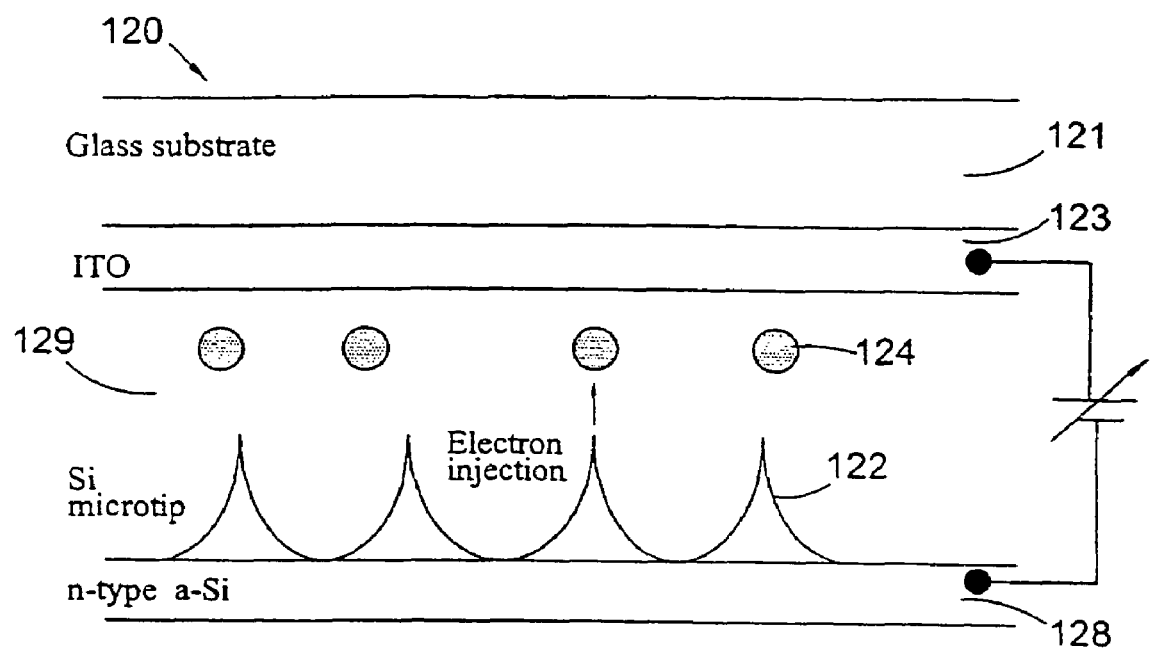
FIG. 12A a schematic representation of an electro-luminescent display device according to a fourth embodiment of the present invention.
Figure 12B:
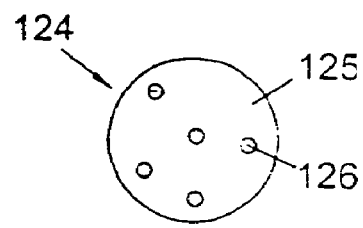
FIG. 12B a schematic representation of a second dye doped fluorescent polymer sphere for use in the present invention.

In a fourth embodiment of the present invention, an electro-luminescent device 120, such as that shown in FIG. 12A, is provided with a wide band-gap light emitting material which is a polymer dispersed liquid crystal film (PDLC). The PDLC film is formed of spheres or droplets 124 of approximately 1 micron or less of liquid crystal polymer 125, which is shown in FIG. 12B. Typically the droplets 124 are of a size corresponding substantially to that of the wavelength of light. These droplets 124 are doped with fluorescent dye molecules 126 which are dissolved in the polymer 125, with the dye dope liquid crystal polymer 125 being dispersed in a solid polymer matrix 129. The polymer matrix 129 is in this case NOA65 (Norland), which is a commercial ultra-violet (UV) curable polymer. As this polymer has a refractive index of n=1.524, the liquid crystal must have a lower refractive index. Therefore, in this case the nematic liquid crystal polymer mixture 125 is TN5604 having a refractive index of n=1.499. In this case the fluorescent dye C6 is dissolved in the liquid crystal 125. As the refractive indices of the liquid crystal droplets 124 do not match the refractive index of the polymer matrix 129, electrons injected from microtips 122 colliding with the fluorescent dye droplets 126 create fluorescent light which is partially reflected from the liquid crystal-polymer interface, due to total internal reflection. Furthermore, if the diameter of the liquid crystal droplets 124, is the same as the wavelength of the emitted fluorescent light, optical resonance enhances the output light intensity. In order to achieve this optical resonance, the optimum diameter of the fluorescent dye containing liquid crystal droplets is determined during the preparation of the droplets by illuminating the material mixture with UV light. When the diameter of the droplet 124 matches the wavelength of the fluorescent light, optical resonance occurs enhancing the light intensity and therefore the optimum diameter is known.

Figure 13:
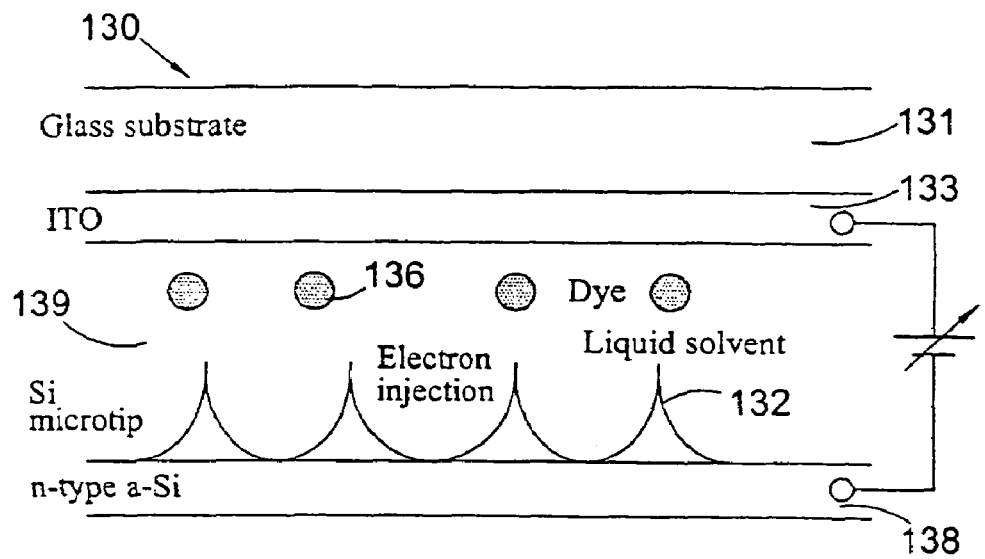
FIG. 13 a schematic representation of an electro-luminescent display device according to a fifth embodiment of the present invention.

An electro-luminescent device according to a fifth embodiment of the invention is shown in FIG. 13. In this embodiment the wide band-gap light emitting material layer of the device 130 is formed of a liquid solvent 139, in this case the organic aromatic solvent toluene, in which fluorescent dye molecules 136, in this case C6 molecules, are dissolved. The use of a dye doped solvent polymer 139, means that both the solvent molecules and the fluorescent dye molecules can move freely in the space between the two electrodes, that is the Si microtips 132 and the ITO 133. Thus the microtips 132 are less likely to be damaged by the high energy electrons emitted. Furthermore, heat generated at the dye site during collision with high energy electrons can be conducted away by convection in the liquid state. A further advantage is that using dye doped liquid polymer material reduces the effect of differential ageing as the molecules in the material move around, and therefore, do not get used predictably, consistently or regularly.

The light emitting material of this arrangement may alternatively be formed of aromatic solvent such as styrene and methyl styrene. These monomers and liquids dissolve the fluorescent dyes without significantly quenching the fluorescent efficiency of the fluorescent dyes.

It should be understood that in each of the above light emitting materials, more than one fluorescent dye can be used to dope the material. For example, in the devices incorporating more than one light emitting material, polymer or liquid, it is possible to generate white light emission. In particular by incorporating concentrations of red, green and blue fluorescent dyes in a ratio according to additive white color, white light emission can be achieved when hot electrons excite the individual molecules in the liquid phase.

Figure 14:
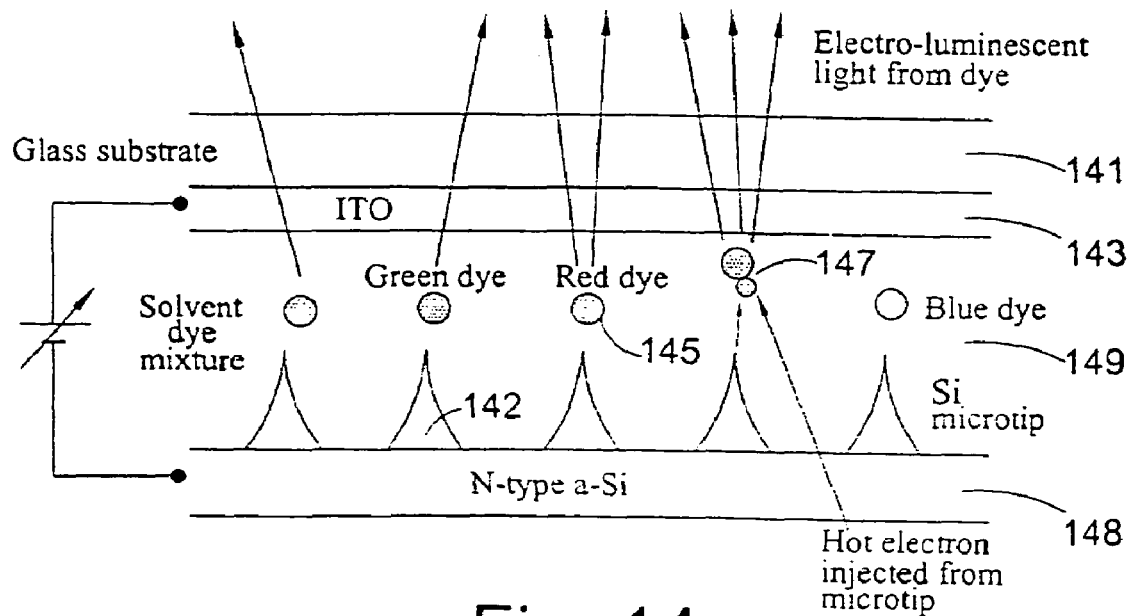
FIG. 14 a schematic representation of an electro-luminescent display device according to a sixth embodiment of the present invention.

By using an appropriately ratioed mix of red, green and blue fluorescent dyes, the microtip white emitting solvent/dye mixture based device can be used as a backlight for liquid crystal display panels. The device structure, which generates white light, is illustrated in FIG. 14 according to a sixth embodiment of the present invention.

The use of a liquid solvent, in the arrangements shown, allows the movement of the fluorescent dyes in the space thus dispersing extra non-luminous energy, and furthermore the degree of dye efficiency in the common liquid phase will be equal for red, green and blue fluorescent dyes thus providing the stability of emitted color gamut for prolonged operation of the device.

Figure 15:
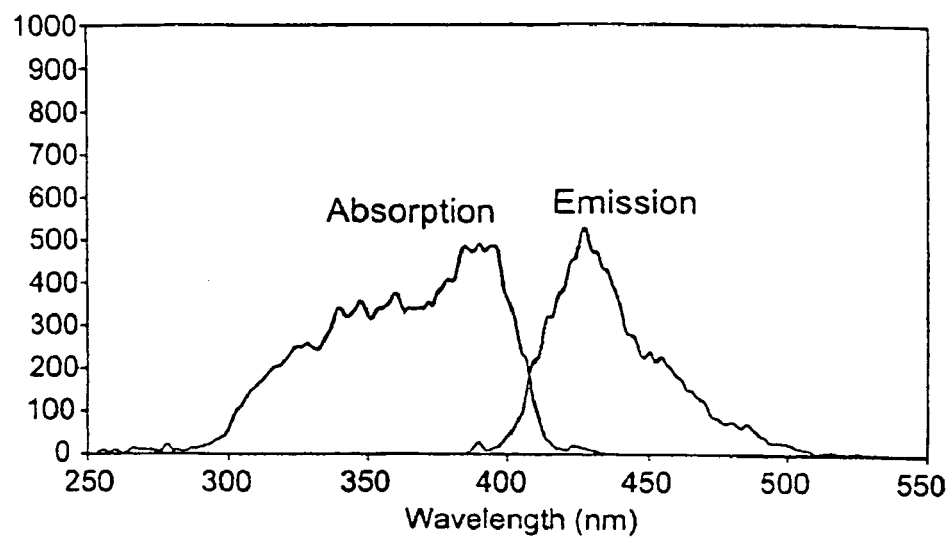
FIG. 15 a graphical representation of an absorption-emission spectra of the first fluorescent dye doped polymeric material suitable for use in the present invention (FIG. 6)

The graph shown in FIG. 15 illustrates the photo-luminescence (absorption-emission) of BisMSB doped PMPSi (0.1 wt %) which has peak emission intensity of around 430 nm. The use of fluorescent dye doped polymer materials, wherein the dye is chemically attached to the polymer, enables fabrication of light emitting devices using a wet coating process (such as spin coating, dip coating, or solution casting) at low cost due to the morphological stability of these materials. Furthermore, properties of the polymers can be optimized by structural modification such as cross-linking doping and applying stress. These modifications may provide the material with more desirable light emitting properties, processability, electron transporting properties and also electron injection properties. In this way, the device performance can also be modified through the alteration or modification of the polymer structures.

Figure 16:
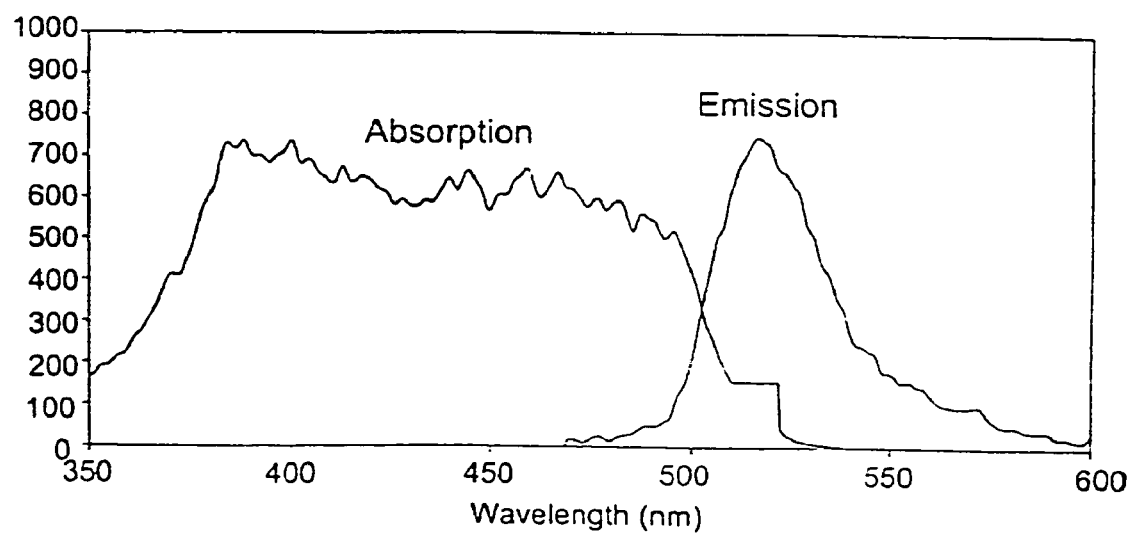
FIG. 16 a graphical representation of an absorption-emission spectra of the second fluorescent dye doped polymeric material suitable for use in the present invention (FIG. 8)

In FIG. 16 there is shown a graphical representation of the photo-luminescence (absorption-emission) spectrum of C6 doped PMPSi. As can be seen from this, the peak emission intensity occurs all around 518 nm.

Figure 17:
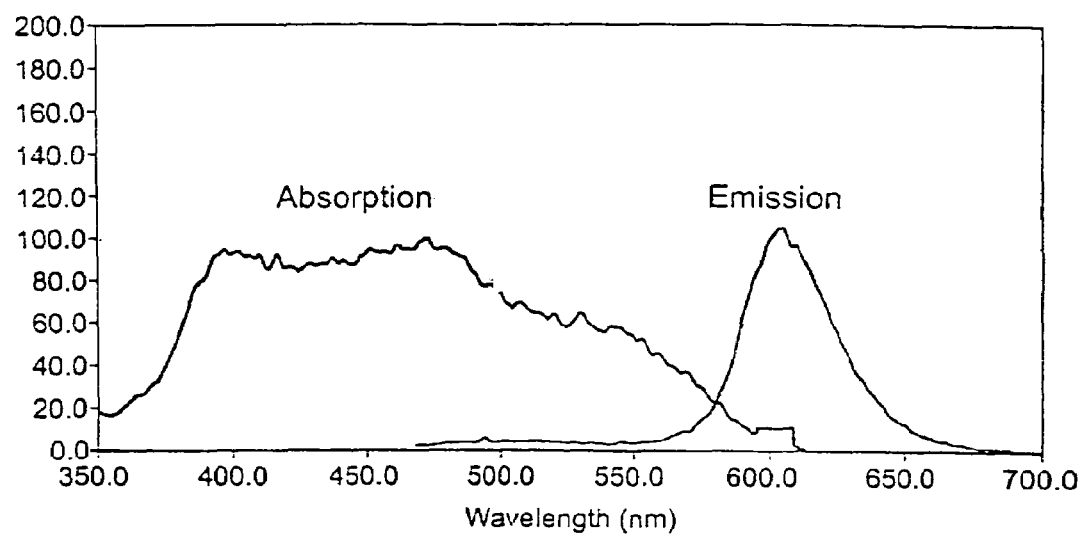
FIG. 17 a graphical representation of an absorption-emission spectra of the third fluorescent dye doped polymeric material suitable for use in the present invention (FIG. 9)

The graph shown in FIG. 17 illustrates the photo-luminescence (absorption-emission) of Nile Red doped PMPSi (0.1 wt %) which has peak emission intensity at around 605 nm.

Figure 18:
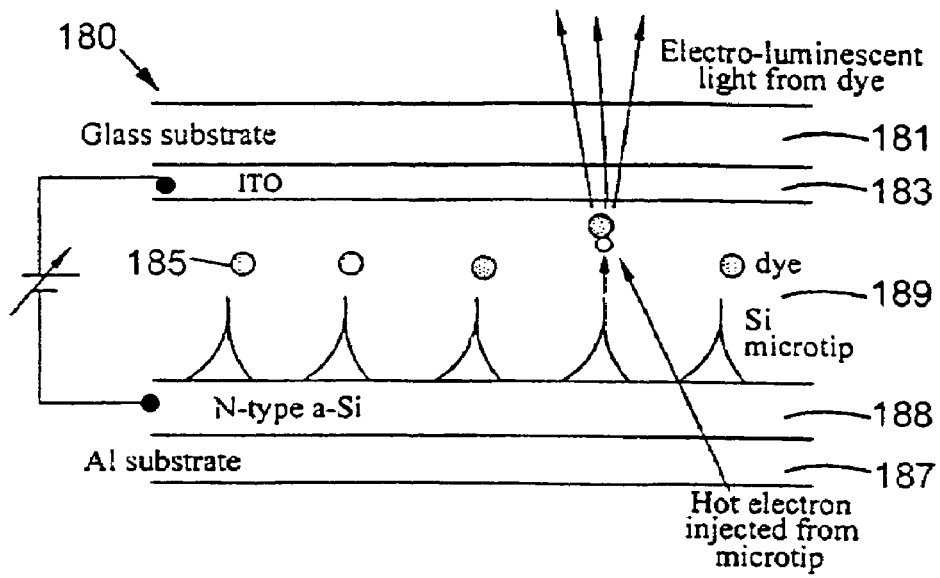
FIG. 18 a schematic representation of an electro-luminescent device according to a seventh embodiment of the invention.
Figure 19:
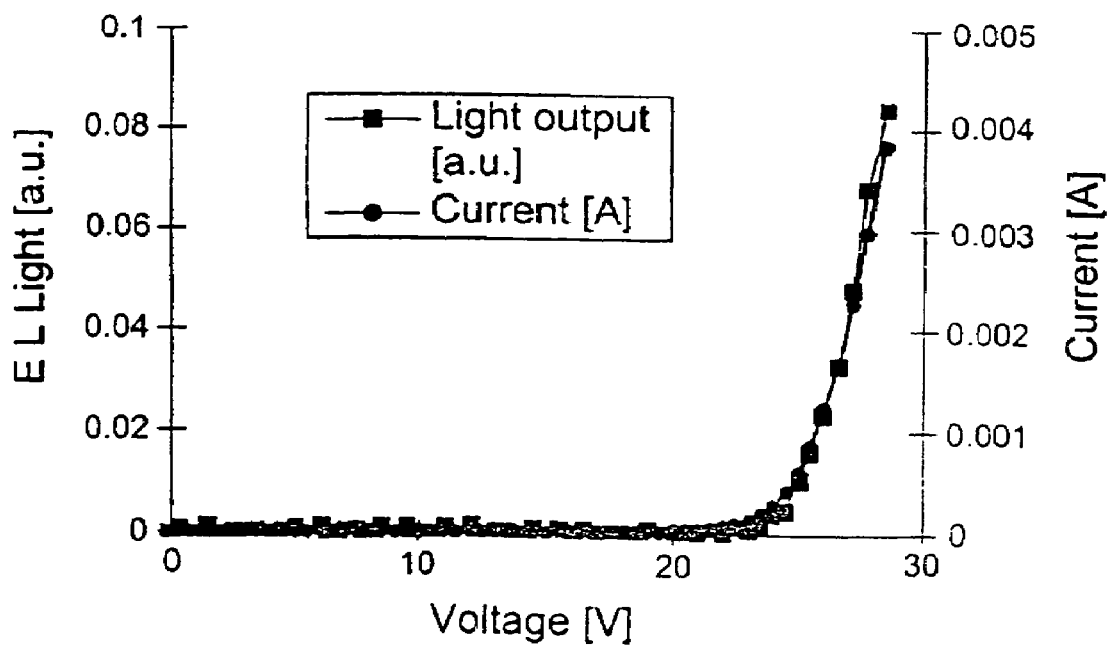
FIG. 19 a graphical representation of characteristics of an electro-luminescent device according to the present invention.

An example device 180 according to a seventh embodiment of the present invention containing a dye doped polymer light emitting layer will now be described in detail with reference to FIG. 18. The device 180 is a single layered sandwich structure comprising the following layers: glass substrate 181; indium tin oxide (ITO) 183; BisMSB 185 doped PMPSi 189; amorphous silicon 188 and aluminium substrate 187. The ITO glass layer 181 has a sheet resistance of 30 Ohm/sq and serves in this arrangement as a transparent electrode. The BISMSB doped PMPSi 189 is spin coated onto the ITO coated glass 183 resulting in a thin polymer film deposition. The thin polymer film was spin coated from a chloroform solution onto the ITO glass (ITO thickness=around 150 nanometers) resulting in a polymer layer thickness of around 120 nanometers. After the deposition of the polymer 189, an aluminium electrode of 100 nanometer thickness was vacuum deposited to pressure of $6 \times 10^{-6}$ Torr with a layer of amorphous silicon. For the purposes of this description the active area of the device 180 is considered as being 1 $cm^2$. The electro-luminescent device 180 is driven using a positive voltage cycle applied to ITO electrode. The turn on voltage is approximately 20 volts and this can be seen in the graph shown in FIG. 19. This graph shows the current-voltage and electro-luminescent light characteristics of the above described device 180, wherein the doping of the polymer is at 0.1 wt %. The electro-luminescence output from the device 180 is blue and closely matches the photo-luminescence spectrum illustrated in FIG. 15.

The structure of the electro-luminescent device which has been previously described can alternatively comprise a metal, insulator, polymer-dye, metal structure using an AC driving electron injection. As with the previously described structures the electrons excite the dye in the polymer by impact ionization.

Figure 20A:
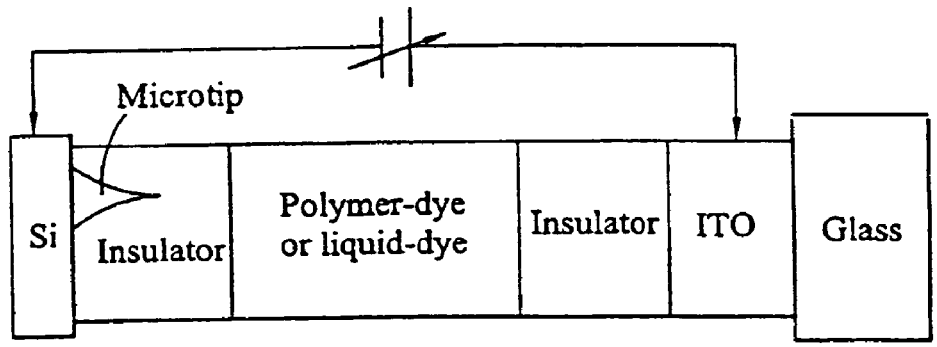
FIG. 20A a schematic representation of an electro-luminescent device structure according to a further embodiment of the present invention.

In FIG. 20A there is shown such a metal-insulator polymer/dye-insulator metal structure device according to a further embodiment of the present invention, which is operated using an AC driving electron injection.

Figure 20B:
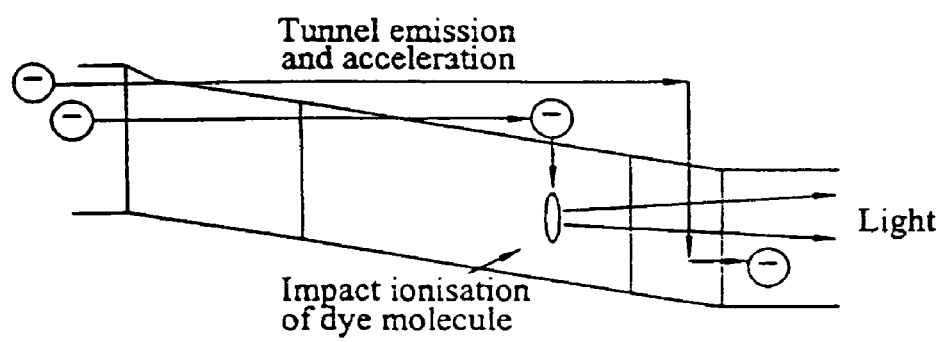
FIG. 20B a schematic representation of a tunnel emission process of the electro-luminescent device of FIG. 20(A).

FIG. 20B shows a representation of a tunnelling/emission process in a device corresponding to the structure of the above device. Electro-luminescent light is generated by impact ionization of hot electrons injected over the insulator barrier. The electron injection into the light emitting material is obtained by tunnel emission which is a threshold-like process. Below the threshold voltage, the device acts as a loss free capacitor. Above the threshold voltage, the electrons injected into the polymer or liquid are energetic enough to excite the dye by impact ionization.

A further feature which can be utilized in the previously described arrangements is that the fluorescent dye or dyes can, as well as being used as the dye dopant, be used as at least a part of the polymer backbone, and therefore, other dyes can be attached to the polymer backbone or as a side group to provide enhanced light emission. For example, a first dye can be used as the polymer backbone and then C6 can be attached as a side group to provide enhanced light emission.

It should be understood that in each of the arrangements detailed in the description copolymers may be used instead of, or in combination with, polymers or monomers in the forming of the light emitting material.

It will be appreciated that the embodiments of the present invention hereinbefore described are given by way of example only, and are not meant to be limiting of the scope thereof. Various modifications may be made to the arrangements as hereinbefore described without departing from the scope of the present invention.

For example, in polymeric materials such as that shown in FIG. 7, the main chain polymer may, or may not, have further functional groups to join the repeat units together, i.e. further functional groups attached at the open ends of D or N2, as illustrated. These groups may be, for example, ester groups, ether groups or amide groups. This means that the main chain polymers, in particular those with functional linking groups, may be selected from polyester, polyether, polyamide, polycarbonate etc. Furthermore, such invented dye doped polymers or copolymers may have more than one monomer unit or dye unit in the polymer chain, i.e. p, n and m can be varied.

It should also be noted that, although in the disclosed embodiments each of the described electro-luminescent devices comprises only a single layer of electro-luminescent material between the electrodes, a multiple number of layers may alternatively be provided.

In the arrangement shown in FIGS. 11A and 11B, the polymer spheres are formed of polystyrene, however, such may be formed of other similar materials such as PMMA.

Furthermore, in the embodiments involving embedded spheres, it has been detailed that such spheres advantageously have a diameter corresponding to the wavelength of the emitted light. As this is the optimum arrangement, as this is when optical resonance occurs, the device will still operate (although not as efficiently) when this criteria is not met.

In the arrangement comprising PDLC film doped with fluorescent dye, the described matrix polymer is detailed as NOA65 (Northened). However, CN934D60 (Satimere) having a refractive index of 1.505, may be used. The liquid crystal mixtures which may be dissolved in such a matrix polymer, arrangement are dependent upon the refractive index of the matrix polymer, and in this respect commercial material such as TN10396, TN0623, TN043, BL036 having refractive indices of N=1.507, 1, 1.507, 1,524, 1.527, respectively, may be used as the liquid crystal material in devices comprising NOA65, CN934D60 etc. However, other polymers with lower refractive indices than those listed above, for example, fluorinated acrylics, are also suitable.

In the arrangement illustrated in FIG. 13, the liquid solvent is detailed as being toluene. However, xylene and fluorylbenzene, as well monomers such as styrene and methyl styrenes, may also be used, as can vinyl polymers such as methyl methacrylate.

Similarly, with reference to the detailed high temperature polymer, alternative high temperature polymers such as polyvinyl-cyclohexane (isotactic) having $T_m$=325° C., and cyclo-olefin copolymers such as those produced commercially by Asahi and Ticona ("Topaz") may be used satisfactorily.

In particular by incorporating concentrations of red, green and blue fluorescent dyes in a ratio according to additive white color, white light emission can be achieved when hot electrons excite the individual molecules in the liquid phase.

In each of the disclosed arrangements the dye dopant has been C6. However, any of a variety of dye dopants may be used, for example, dyes such as Nile Red or BisMSB, or other fluorescent dyes such as N,N'-Bis(2,6-dimethylphenyl)-3,4,9,10-peryleneteracarboxylic diimide (green fluorescent dye), Brilliant Cresyl Blue ALD (red fluorescent dye), Coumarin 314 (blue fluorescent dye), Lumogen Red (red emitter), Lumogen Green (green emitter), Lumogen Violet (blue emitter) and other similar fluorescent dyes or other fluorescent laser dyes are suitable for use.

The chemical attachment of the fluorescent dyes to the PMPSi and PBPMSi polymers via bonds to —$CH_2$ groups of the polymers has been detailed. However, the dyes may be bonded via aryl or alkoxy groups of the polymers.

What is claimed is:

1. A field emission device comprising a field emission backplate made from a substantially semiconductor based material and comprising a plurality of grown tips, the field emission device further comprising at least one electro-luminescent material, the at least one electro-luminescent material having at least one fluorescent material chemically attached thereto.

2. The field emission device as claimed in claim 1, wherein the semiconductor based material comprises a thin film.

3. The field emission device as claimed in claim 1, wherein the grown tips are profiled in a manner resulting in a sharp pointed shape.

4. The field emission device as claimed in claim 1, wherein the semiconductor based material is silicon or an alloy thereof.

5. The field emission device as claimed in claim 1, wherein the at least one fluorescent material comprises at one or more fluorescent dyes.

6. The field emission device as claimed in claim 5, wherein the at least one fluorescent material comprises a fluorescent dye doped material comprising a polymer which is combined with Nile red, C5, and BisMSB dyes for red, green and blue light generation.

7. The field emission device as claimed in claim 6, wherein the polymer is a poly (9-alkylfluorene) or a poly (9,9-dialkylfluorene).

8. The field emission device as claimed in claim 1, wherein the at least one electro-luminescent material comprises a polymeric or organic material, or a fluorescent material.

9. The field emission device as claimed in claim 1, which further comprises a substrate, a fluorescent dye doped material layer comprising the at least one electro-luminescent material having at least one fluorescent material chemically attached thereto, and a transparent window.

10. The field emission device as claimed in claim 9, wherein the transparent window comprises a thin film transparent metal or metallized phosphor.

11. The field emission device as claimed in claim 10, wherein at least one fluorescent dye molecule of the at least one fluorescent material is chemically attached to a polymeric material of the at least one electro-luminescent material molecule as a side group, is chemically attached to a polymeric material of the at least one electro-luminescent material by incorporation into a polymeric material molecule main chain backbone, is an amorphous polysilyene doped with at least one fluorescent dye chemically attached to the polymeric material, or a high temperature polymer doped with at least one fluorescent dye.

12. The field emission device as claimed in claim 11, wherein the polymeric material is a polymer including a homopolymer or copolymer, a high temperature polymer, or a pyrazol based organic material.

13. The field emission device as claimed in claim 1, wherein the at least one fluorescent material comprises at one or more fluorescent dye doped materials comprising polymer based micro-spheres formed of a first polymeric material doped with at least one fluorescent dye, wherein the micro-spheres of the first polymeric material are embedded within a polymer based host, and wherein the polymer material based host is formed of a second polymeric material, optionally one having a lower refractive index or lower softening temperature than the first polymeric material.

14. The field emission device as claimed in claim 13, wherein the first polymeric material comprises polystyrene doped with at least one fluorescent dye, or an ethylene-vinyl-acetate based polymer.

15. The field emission device as claimed in claim 13, wherein the micro-spheres are formed of ethylene-vinyl acetate based polymer(s) containing chemically attached fluorescent dye(s) on the polymer main chain, of ethylene-vinyl acetate based polymer(s) containing chemically attached fluorescent dye(s) on the polymer side chain or of ethylene-vinyl acetate polymer(s) containing chemically attached fluorescent dye based compound moieties on both the side chain and the main chain of the polymer.

16. The field emission device as claimed in claim 15, wherein the micro-spheres have diameters that are substantially the same as a wavelength of fluorescent light emitted by the fluorescent dye molecules resulting in optical resonance effects occurring within the micro-spheres thereby enhancing the intensity of the fluorescent light in use.

17. The field emission device as claimed in claim 1, wherein the at least one fluorescent material comprises at one or more fluorescent dye doped materials comprising an organic polymer, and optionally a pyrazole polymer, wherein at least one fluorescent dye is chemically bonded to molecules of the organic polymer.

18. A field emission device as claimed in claim 1, comprising a field emission means and the electro-luminescent material doped with at least one fluorescent dye doped material, wherein the electro-luminescent material is a fluid.

19. The field emission device as claimed in claim 18, wherein the fluorescent dye doped material is a polymer dispersed liquid crystal fluid, and the liquid crystal fluid is doped with at least one fluorescent dye and optionally is dispersed within a solid polymer matrix or is dissolved within the liquid crystal fluid.

20. The field emission device as claimed in claim 18, wherein the polymer matrix material has a refractive index that is not matched to that of the liquid crystal fluid, or is lower than the refractive index of the liquid crystal fluid.

21. The field emission device as claimed in claim 18, wherein the fluorescent dye doped material comprises a liquid solvent doped with at least one fluorescent dye, wherein the liquid solvent is a monomer or polymer based material or is an aromatic or fluorinated aromatic solvent optionally selected from toluene, xylene, or fluoro-benzene.

22. The field emission device as claimed in claim 18, wherein the fluorescent dye doped material comprises a liquid solvent, and the liquid solvent is doped with red fluorescent dye, green fluorescent dye and blue fluorescent dye with the ratio of each dye being such that, in use, each can be caused to emit red, green or blue light in a manner which additively can produce white light, wherein the device using such a white color emitting solvent-dye mixture is adapted for use as a backlight for a liquid crystal display panel.

23. The field emission device as claimed in claim 22, wherein the organic monomer is an electron transport monomer of 1,2,4- triazole (TAZ) or Tris (8-quinolato) aluminium (III) complex (ALQ).

24. The field emission device as claimed in claim 1, further comprising plurality of discrete bodies of material interspersed in a host material, wherein the discrete bodies comprise spheres, micro-spheres or droplets.

25. The field emission device as claimed in claim 24, wherein the discrete bodies have a size or diameter of within the wavelength range of visible light, or have a concentration within the host material of within the range 1% to 80%, and optionally within the range 1% to 60%.

26. The field emission device as claimed in claim 1, wherein, in use, the device employs AC driving electron injection, the electrons exciting the fluorescent dye in the electro-luminescent or photo-luminescent material by impact ionization, wherein the device has a threshold voltage below which the device acts as a loss free capacitor and above which the electrons injected into the electro-luminescent or photo-luminescent material excite the dye by impact ionization.

27. A display or light emitting device comprising the field emission device as claimed in claim 1.

\* \* \* \* \*

UNITED STATES PATENT AND TRADEMARK OFFICE
CERTIFICATE OF CORRECTION

PATENT NO. : 7,304,420 B2  Page 1 of 1
APPLICATION NO. : 11/016346
DATED : December 4, 2007
INVENTOR(S) : Rose et al.

It is certified that error appears in the above-identified patent and that said Letters Patent is hereby corrected as shown below:

Column 17:
Line 58 (claim 5, line 2), after "material comprises", delete "at".

Column 18:
Line 29 (claim 13, line 2), after "material comprises", delete "at".
Line 59 (claim 17, line 2), after "material comprises", delete "at".

Signed and Sealed this

Eighth Day of April, 2008

JON W. DUDAS
*Director of the United States Patent and Trademark Office*